United States Patent
Feller et al.

(10) Patent No.: US 7,182,882 B2
(45) Date of Patent: Feb. 27, 2007

(54) METHOD OF IMPROVING CHEMICAL MECHANICAL POLISH ENDPOINT SIGNALS BY USE OF CHEMICAL ADDITIVES

(75) Inventors: Allen D. Feller, Portland, OR (US); Kenneth C. Cadien, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 447 days.

(21) Appl. No.: 10/038,076

(22) Filed: Jan. 2, 2002

(65) Prior Publication Data

US 2003/0124855 A1   Jul. 3, 2003

(51) Int. Cl.
*C09K 13/06* (2006.01)

(52) U.S. Cl. .................. 252/79.4; 438/692; 134/36; 451/1; 51/308; 51/309

(58) Field of Classification Search ............... 252/79.1, 252/183.11, 79.4; 438/692; 134/36; 451/1; 51/308, 309; 206/527
See application file for complete search history.

(56) References Cited

U.S. PATENT DOCUMENTS

| 5,340,370 | A | 8/1994 | Cadien et al. |
| 5,783,489 | A * | 7/1998 | Kaufman et al. ........... 438/692 |
| 5,954,997 | A * | 9/1999 | Kaufman et al. .......... 252/79.1 |
| 2001/0037821 | A1* | 11/2001 | Staley et al. ............... 134/25.4 |

* cited by examiner

*Primary Examiner*—Cephia D. Toomer
(74) *Attorney, Agent, or Firm*—Blakely, Sokoloff, Taylor & Zafman LLP (57) ABSTRACT

A method for buffering a chemical mechanical polish chemical slurry is disclosed. Buffering the slurry reduces buildup of local acidic areas at the interface between the polished metal and the polishing pad. Reduction of the local acidic areas improves the uniformity of the polish and an endpoint signal used to determine when to finish the polish operation.

16 Claims, 6 Drawing Sheets

REMOVING EXCESS VIA MATERIAL FROM AN INTEGRATED CIRCUIT WAFER BY CHEMICAL MECHANICAL POLISHING THE WAFER WITH A SLURRY AND AN OXIDATION AGENT FOR THE VIA MATERIAL ON A SURFACE
710

↓

MONITORING THE CURRENT REQUIRED TO ROTATE THE WAFER ON THE SURFACE AS A MEASURE OF THE EXCESS VIA MATERIAL REMOVAL ENDPOINT
720

↓

OPTIMIZING THE ENDPOINT SIGNAL BY BUFFERING A SLURRY USED IN THE CHEMICAL MECHANICAL POLISH
730

METHOD OF IMPROVING CHEMICAL MECHANICAL POLISH ENDPOINT SIGNALS BY USE OF CHEMICAL ADDITIVES

BACKGROUND

1. Field of the Invention

The present invention relates to the field of semiconductor integrated circuit manufacturing, and more specifically, to chemical additives for improved end point signals for slurries for the chemical mechanical polishing (CMP) of thin films used in semiconductor integrated circuit manufacturing.

2. Background

Today, integrated circuits can be made up of literally millions of active devices formed in or on a silicon substrate. The active devices which are initially isolated from one another are later connected together to form functional circuits and components. The devices are typically interconnected together through the use of multilevel interconnections.

Figure 1:
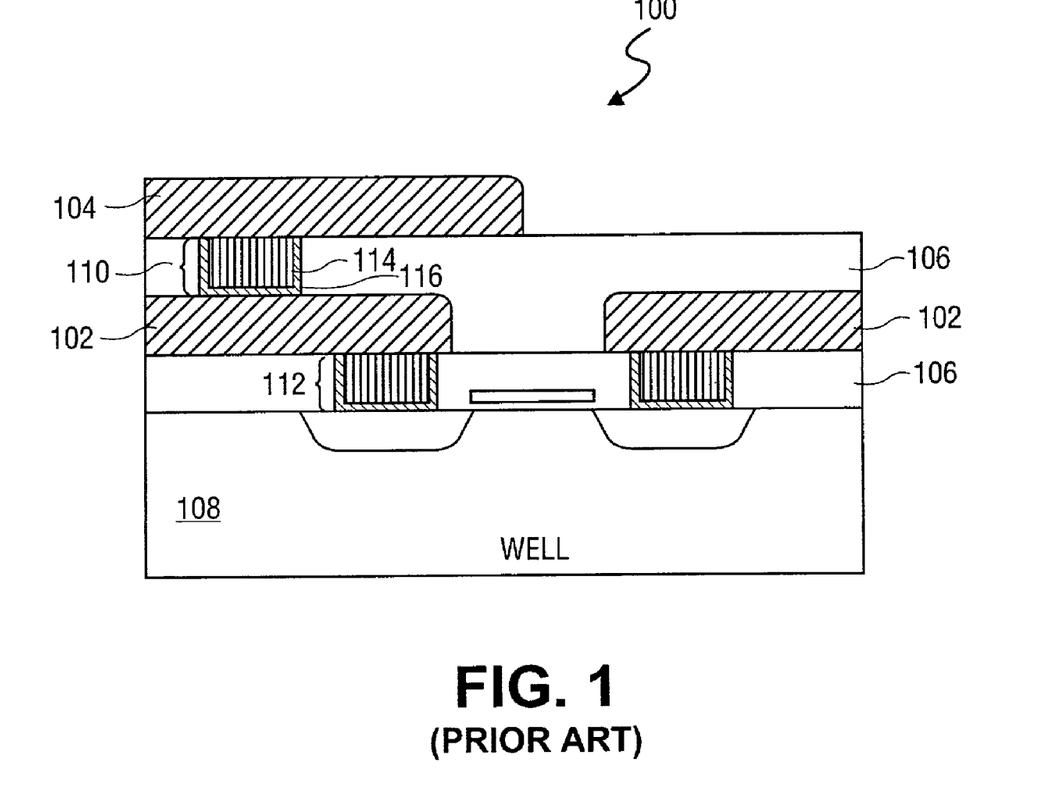
FIG. 1 is a schematic cross-sectional illustration of a typical multilevel interconnection structure.

A cross-sectional illustration of a typical multilevel interconnection structure 100 is shown in FIG. 1. Interconnection structures typically have a first layer of metallization, an interconnection layer 102 (typically a copper alloy or an aluminum alloy with up to 3% copper), a second level of metallization 104, and sometimes a third, fourth or even higher level of metallization. Interlevel dielectrics 106 (ILDs), such as doped and undoped silicon dioxide ($SiO_2$), are used to electrically isolate the different levels of metallization in silicon substrate or well 108.

The electrical connections between different interconnection levels are made through the use of metallized vias, such as metallized via 110 formed in ILD 106. In a similar manner, metal contacts such as metal contact 112, are used to form electrical connections between interconnection levels and devices formed in or on substrate or well 108. The metal vias 110 and contacts 112, hereinafter being collectively referred to as "vias" or "plugs", are generally filled with tungsten 114 and generally employ an adhesion layer 116 such as titanium nitride (TiN). Adhesion layer 116 acts as an adhesion layer for the tungsten metal layer 114 which is known to adhere poorly to $SiO_2$. At the contact level, the adhesion layer also acts as a diffusion barrier to prevent a reaction between tungsten and silicon of the substrate or well 108.

Figure 2:
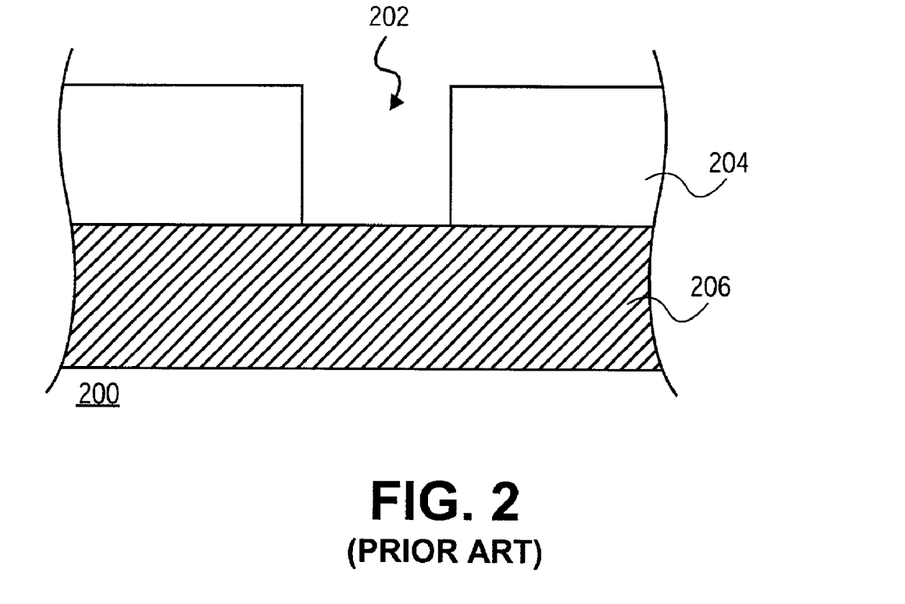
FIG. 2 is a schematic cross-sectional side view of a via hole through an interlayer dielectric.
Figure 3:
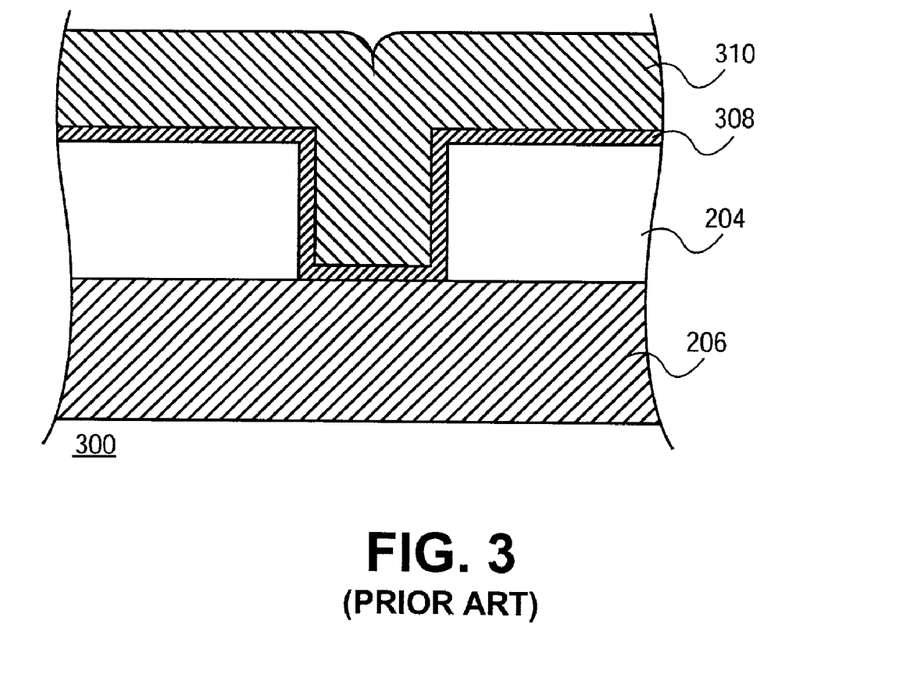
FIG. 3 is a schematic cross-sectional side view of an adhesion layer and via material on an interlayer dielectric.

In one process for filling vias which has presently gained wide interest, metallized vias or contacts are formed by a blanket tungsten deposition and a chemical mechanical polish (CMP) process. In a typical process, illustrated in FIGS. 2–4, via holes, such as via hole 202, are etched through an ILD 204 to interconnection lines or substrate 206 formed below. Next, thin adhesion layer 308, such as TiN, is generally formed over ILD 204 and into via hole 202, as shown in FIG. 3. Next, a conformal tungsten film 310 is blanket deposited over adhesion layer 308 and into via 202. The deposition is continued until via hole 202 is completely filled with tungsten. Next, the metal films formed on the top surface of ILD 204 are removed by chemical mechanical polishing, thereby forming metal vias or plugs 110 shown in FIGS. 1 and 4.

Figure 4:
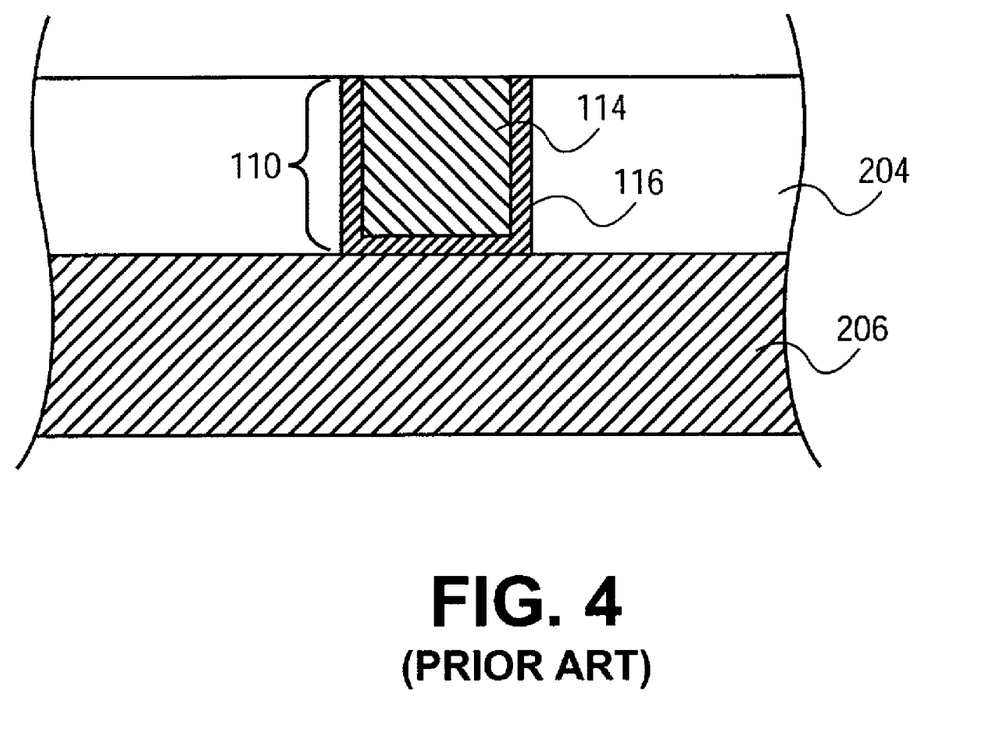
FIG. 4 is a schematic cross-sectional side view of a via after chemical mechanical polish removal of the excess tungsten.

FIG. 4 is a side view schematic cross-section illustrating a via after chemical mechanical polish removal of the excess tungsten. All excess tungsten 310 and adhesion layer 308 have been removed and the via 110 is flush with ILD layer 204. Via 110 fills the gap between layers in ILD 204. Via 110 may contact the top of an interconnection line or a substrate 206.

In a typical chemical mechanical polishing process, a substrate or wafer is placed face-down on a polishing pad which is fixedly attached to a rotatable table. In this way, the thin film to be polished is placed in direct contact with the polishing pad. A carrier or chuck is used to apply a downward pressure against the backside of the substrate or wafer. During the polishing process, polishing pad, and the table on which the polishing pad is mounted, are rotated. The substrate is also rotated by a motor coupled to carrier. An abrasive and chemically reactive solution, commonly referred to as a "slurry", is deposited onto the polishing pad during polishing. The slurry initiates the polishing process by chemically reacting with the film being polished. The polishing process is facilitated by the rotational movement of the polishing pad relative to the wafer, and rotation of the wafer on the polishing pad, as slurry is provided to the wafer/pad interface. Polishing is continued in this manner until all of the film on the wafer is removed.

Slurry composition is an important factor in providing a manufacturable chemical mechanical polishing process. Several different tungsten slurries have been described in literature. One slurry available is Commercial Tungsten Slurry: Semi Sperse W2000 available from Cabot Corporation/Microelectronics Materials Division of Aurora Ill. It has been found that slurries support a chemical reaction of the material being polished in addition to assisting with the physical removal of the material from a substrate by physical means. Many slurries contain an abrasive such as silica $SiO_2$ or alumina $Al_2O_3$ to remove oxidized material from a substrate.

When tungsten is placed in water there is a spontaneous reaction generating an oxidation product. The tungsten and water react to form tungsten oxide, hydrogen ions and free electrons. The reaction may be described as:

$$W+3H_2O \leftrightarrows WO_3+6H^++6e^- \quad E^0=0.19 \text{ v} \qquad ((1))$$

The oxidation potential, $E^0$, of equation (1), which is 0.19 v, indicates that this is a spontaneous reaction. However, while this reaction occurs spontaneously, it is not very fast. The generation of the hydrogen ions indicates, however, that this is an acidic reaction. To enhance the reaction rate of the oxidation of the tungsten, hydrogen peroxide is added to the CMP chemical environment. The hydrogen peroxide acts as an oxidizing agent providing a capability to accept electrons. This reaction may be described by the equation:

$$H_2O_2+2H^++2e^- \leftrightarrows 2H_2O \quad E^0=1.77 \text{ v} \qquad ((2))$$

The balanced reduction oxidation ("redox") equation is shown below:

$$W+3H_2O_2+3H_2O+6H^+ \leftrightarrows WO_3+6H^+ + 6H_2O \quad E^0=1.96 \text{ v} \qquad ((3))$$

Removing common terms, which will still somewhat accurately describe the reaction, reduces the equation to:

$$W+3H_2O_2 \leftrightarrows WO_3+3H_2O \quad E^0=1.96 \text{ v} \qquad ((4))$$

The reaction described in equation (4) has a much higher reaction rate than the reaction described in equation (1).

The oxidation product of equation (4), $WO_3$, is unfortunately not soluble to a sufficient degree to allow removal of the oxidation product so fresh metal may be oxidized. To accelerate removal of the reaction product, an abrasive is added to the slurry. The abrasive may be silica or alumina particles. The abrasive particles physically remove the oxidation product from the metal layer clearing the way for additional oxidation of the metal to be removed.

BRIEF DESCRIPTION OF THE DRAWINGS

The invention is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION

Reference will now be made to drawings wherein like structures will be provided with like reference designations. In order to show the structures of the claims most clearly, the drawings included herein are diagrammatic representations of integrated circuit structures. Thus, the actual appearance of the fabricated structures, for example, in a photomicrograph, may appear different while still incorporating the essential structures of the claims. Moreover, the drawings only show the structures necessary to understand the claims. Additional structures known in the art have not been included to maintain the clarity of the drawings.

Figure 5:
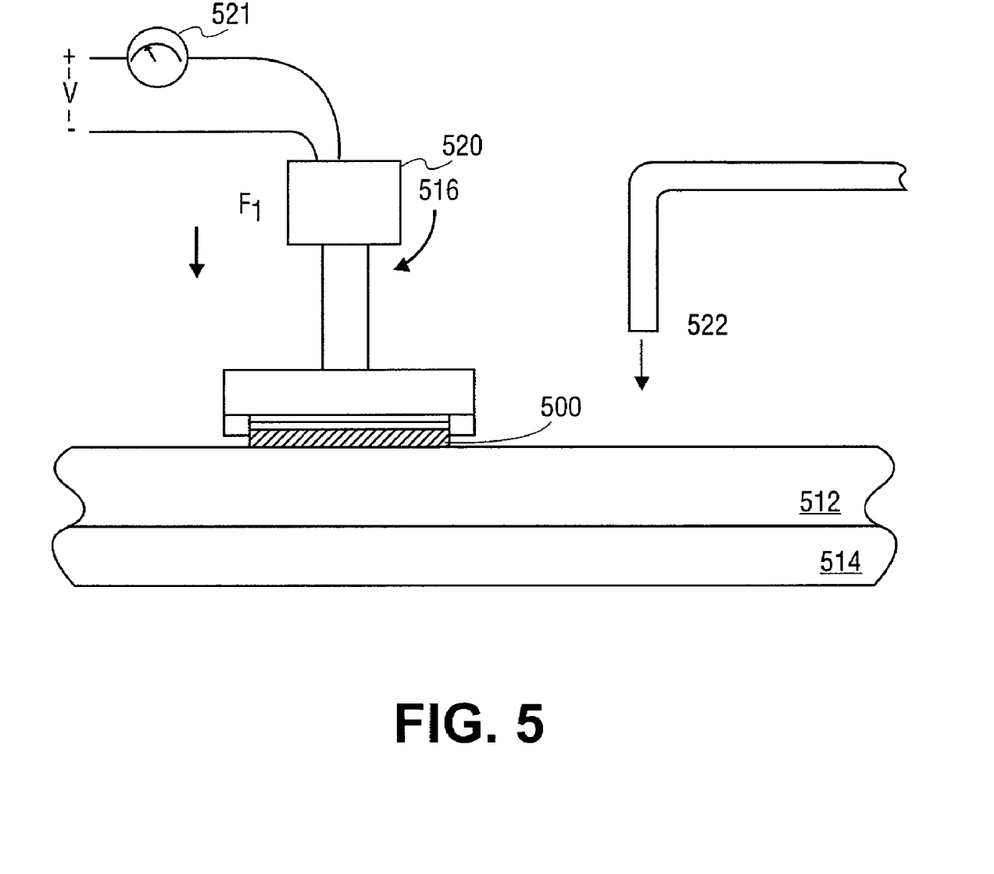
FIG. 5 is a schematic side view illustration of a typical chemical mechanical polishing process.

In a typical chemical mechanical polishing process, as shown in FIG. 5, the substrate or wafer 500 is placed face-down on a polishing pad 512 which is fixedly attached to a rotatable table 514. In this way, the thin film to be polished (i.e., tungsten film 310 shown in FIG. 3) is placed in direct contact with pad 512. A carrier 516 is used to apply a downward pressure $F_1$ against the backside of substrate 500. During the polishing process, pad 512 and table 514 are rotated. Substrate 500 is also rotated by a motor 520 coupled to carrier 516. An abrasive and chemically reactive solution, commonly referred to as "slurry" 522, is deposited onto pad 512 during polishing. The slurry initiates the polishing process by chemically reacting with the film being polished. The polishing process is facilitated by the rotational movement of pad 512 relative to wafer 500, and rotation of wafer 500 on pad 512, as slurry is provided to the wafer/pad interface. Polishing is continued in this manner until all of the film 310 and 308 on insulator 204 is removed In one embodiment, shown in FIG. 5, motor 520 is attached to carrier 516 and rotates the carrier relative to polishing pad 512. Meter 521 attached to motor 520 may record the current required to rotate wafer 300. The amount of current required to rotate wafer 500 on pad 512 is a function of among other things the coefficient of friction between the surface being polished and polishing pad 512. Where the coefficient of friction between the interlayer dielectric and polishing pad 512 is greater than that between the metal and polishing pad 512, a rise in the current required to rotate wafer 500 will be apparent when blanket tungsten 310 has been removed and the majority of the surface being polished is ILD 204.

In one embodiment, motor 520 may be coupled to carrier 516 through a direct drive shaft. In another embodiment, motor 520 may be coupled to carrier 516 through gear wheels and a chain. Carrier 516 may, in one embodiment, grasp the sides of wafer 500 to hold it to polishing pad 512. In another embodiment, carrier 516 may adhere to a backside of wafer 500 by an adhesive, for example a wax. Slurry 522 may dribble down on to the center of polishing pad 512 and spiral out towards the edge of the pad as pad and table 514 rotate. In another embodiment, slurry 522 may saturate up through polishing pad 512 from a slurry source within rotatable table 514. Depending on the embodiment, motor current meter 521 may be an analog current meter, digital current meter, chart strip recorder or a computer readable medium.

The rise in the motor current may be related to an endpoint indicating the CMP of blanket tungsten layer 310 is complete. The period between when polishing pad 512 first contacts ILD 204 and when the last of sacrificial blanket tungsten 310 and blanket adhesion layer 308 have been removed is called the transition period or clearing time.

In one embodiment, in a well-calibrated system, polishing is performed until the middle of the transition period has been reached plus an additional time period, for example, 30 seconds. The characteristics of this transition period or clearing time are dependent on the uniformity of the polish process. Where the polishing process has been performed uniformly across a wafer, there will appear a noticeable change in the current required to rotate substrate 500. Where however, polishing has not been uniform, the transition in the current required to rotate wafer 500 may involve a smaller change in current that is more gradual and harder to detect.

Equation (4) is descriptive of the oxidation reaction taking place at the interface between blanket tungsten layer 310 and polishing pad 512. However it is believed that equation (3) highlights the roots of a failure mode for CMP of blanket tungsten layer 310 by polishing pad 512. Equation (3) shows the generation and eventual consumption of large quantities of hydrogen ions. It is believed these hydrogen ions create localized changes in the pH of the slurry solution at the interface of blanket tungsten layer 310 and polishing pad 512. These hydrogen ions form localized highly acidic regions that cause nonuniformities in the polishing rate of the CMP. The effect of these localized acidic regions is especially critical near and during the transition region from polishing away blanket tungsten layer 310 and polishing ILD 204.

It is believed that the localized acidic regions in the proposed CMP may be reduced if not eliminated by buffering the slurry. A buffer, in this context, is a compound that may absorb or release hydrogen ions without large changes in pH of the compound to which they have been added. Buffers are generally weak acid/salt pairs. In one embodiment, organic acids may act as a buffer. The functional group of an organic acid is the carboxyl group comprising a carbon-oxygen double bond and a hydroxyl group along with the positive ($H^+$) ion in aqueous solutions.

A good example of an organic acid is citric acid. Citric acid has three carboxyl groups making citric acid capable of providing three positive ions. Citrate ion$^{-3}$ then is capable of absorbing three positive ions. In one embodiment, the buffer used for CMP of this tungsten system may be potassium citrate. The soluble salt, (potassium citrate) provides citrate ions as previously stated, available to buffer the hydrogen ions generated by the oxidation of tungsten. The citric acid thus formed dissociates to a degree of about 8 to 10 percent in water. This low disassociation degree allows citrate to absorb hydrogen ions without influencing the pH of the chemical system much. In another embodiment, acetic acid and potassium acetate, or ascorbic acid and potassium ascorbate, may be used as the buffer.

By absorbing the hydrogen ions generated in the oxidation of the tungsten metal in the CMP process, potassium citrate removes the localized acidic regions that cause non-uniformity's in the polishing of blanket tungsten layer 310. Controlling the uniformity of the pH, and therefore the polish of the metal system, contributes to a quick and sharp transition region or clearing time in the CMP of Tungsten.

Figure 6:
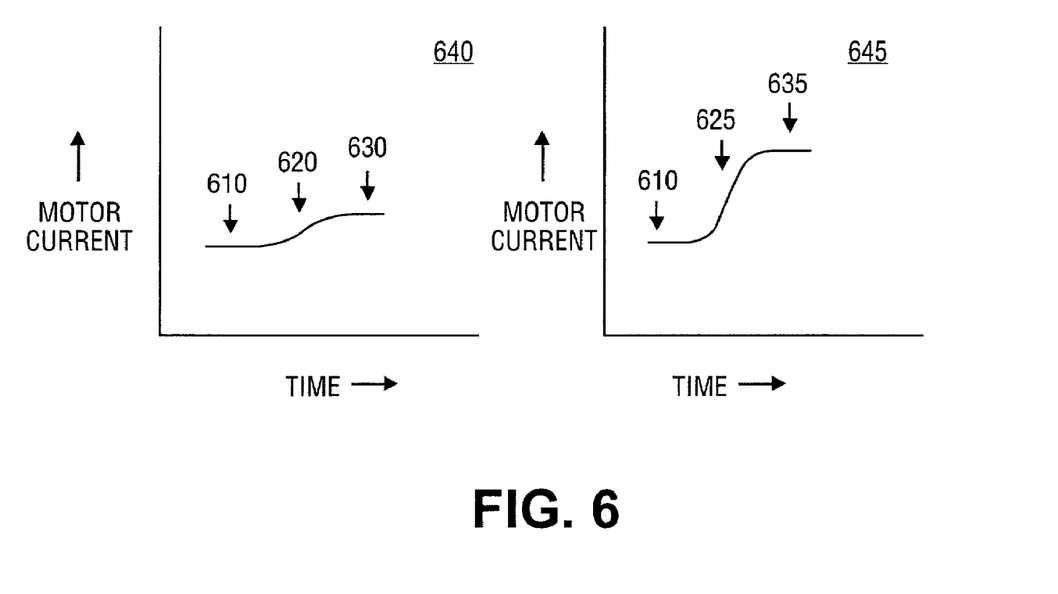
FIG. 6 is an illustration of one embodiment of endpoint comparisons.

A CMP that is sufficiently non-uniform, for example due to localized acidic regions in the slurry, may reduce the change in the motor current to such an extent and prolong the clearing time so long as to allow indicia of the transition to hide in the background noise of the current meter. In such an embodiment, the endpoint is not readily ascertainable, and endpoints may be missed or false positives may be encountered. FIG. 6 illustrates this principle.

The curves in FIG. 6 are idealized representations of the motor current recorded by current meter 521. Current meter 521 records the current required by motor 520 to drive carrier 516 which rotates substrate 500 on polishing pad 512. The curves have had random noise and drift in signal removed to highlight the benefits of the techniques described herein.

Curve 640 in FIG. 6 represents the current required by motor 520 to rotate wafer 500 in an embodiment without a buffer in slurry 522. Region 610 on curve 640 is representative of the current required by motor 520 while the CMP process is polishing blanket tungsten layer 310. Region 610 begins at some arbitrary point in the CMP of blanket tungsten layer 310, and ends as motor current begins to climb because polishing pad 512 begins to encounter ILD 204. Region 620 represents a transition region from when polishing pad 512 first begins to contact ILD 204 until all of the blanket tungsten 310 has been removed, and the only tungsten metal in contact with polishing pad 512 is the tungsten on the top of vias 110. Region 630 represents the current required by motor 520 while polishing wafer 500 after blanket tungsten layer 310 has been removed, and the majority of the material being polished is ILD 204. Current region 630 represents a greater current demand than region 610, because the coefficient of friction between polish pad 512 and ILD 204 is greater than the coefficient of friction between polishing pad 512 and blanket tungsten layer 310. This difference in coefficient of friction is the reason more current is required by motor 520 to rotate wafer 500 after all blanket tungsten 204 has been removed.

The relative difference in motor current required between region 630 and region 610 in FIG. 6 may in one embodiment be measured as about a 9 millivolt signal. In addition, a non-uniform surface may extend the time period over which the transition from polishing blanket tungsten layer 310 to polishing ILD 204 takes place. The combination of the height of the motor current change and the extended clearing time may be such that in many embodiments the transition may be lost in the random or white noise of the recording system.

Curve 645 in FIG. 6 represents the current required by motor 520 to rotate wafer 500 with a buffer in slurry 522. Region 610 on curve 645 is representative of the current required by motor 520 to rotate wafer 500 while the CMP process is polishing blanket tungsten layer 310. Region 610 of curve 645 has been normalized for easier comparison to curve 640. Region 625 represents a transition region from when polishing pad 512 first begins to contact ILD 204 until all of the blanket tungsten 310 has been removed, and the only tungsten metal in contact with polishing pad 512 is the tungsten on the top of vias 110. Region 635 represents the current required by motor 520 while polishing wafer 500 after blanket tungsten layer 310 has been removed, and the majority of the material being polished is ILD 204.

Transition region 625 of curve 645 has a steeper slope and larger differential signal than transition region 620. The differential signal of curve 645 is sometimes three times, and at least twice, the size of the differential signal of curve 640. The combination of steeper slope and greater differential signal make transition region 625 easier to detect than region 620. The buffer placed in slurry 522 has improved the uniformity of the polishing process and increased the end-point signal of the polishing process. The increased endpoint signal increases the reliability of the polish endpoint process from about 95 percent to greater than about 99.9 percent. This increase in endpoint signal reliability changes the failure rate from one in about 20 wafers to about one in 100,000 wafers. This later figure is acceptable for manufacturing.

Figure 7:
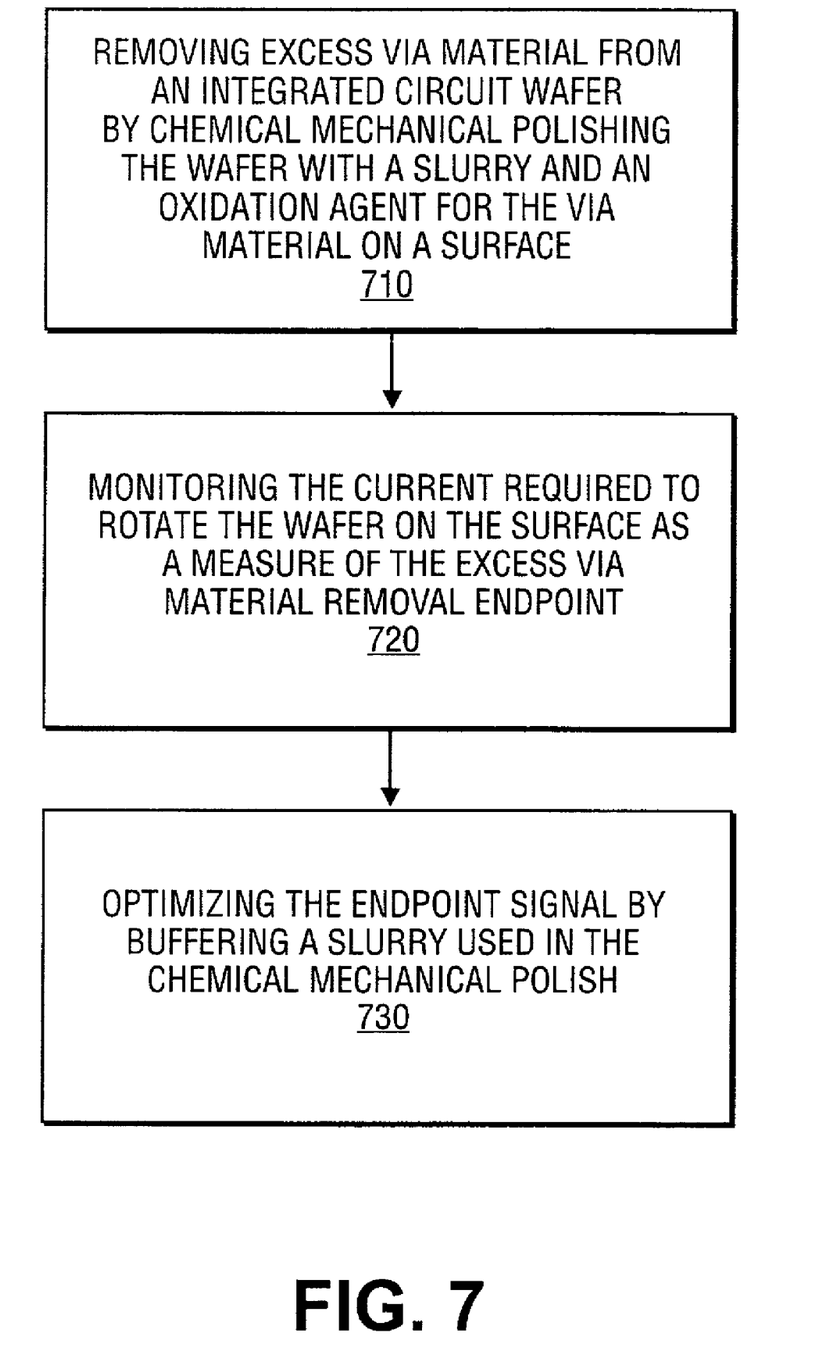
FIG. 7 is a flow chart demonstrating one embodiment of the claims.

FIG. 7 is a flow chart showing one method of chemical mechanical polishing. Excess via material from wafer containing an integrated circuit is removed by the chemical mechanical polish technique. The technique uses a slurry and an oxidizing agent between the via metal and the polishing pad as at block 710. The current required to rotate the wafer on the surface is monitored as a way of measuring the endpoint of the CMP of the excess via material as shown in block 720. The endpoint signal monitored to determine the endpoint of the CMP is optimized by the addition of a buffer to the slurry as shown in block 730.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:
   removing a material from a surface of a wafer by chemical mechanical polishing the wafer with a slurry comprising an oxidation agent for the material and a buffer, and
   monitoring a signal representative of current required to rotate the wafer as a measure of a material removal endpoint,
   wherein the buffer in the slurry is present in an amount sufficient to at least double a differential between a signal measured at a material removal start point and the material removal endpoint relative to a slurry without the buffer.

2. The method of claim 1, further comprising:
   buffering with a weak organic acid/salt pair.

3. The method of claim 2, further comprising:
   buffering with a weak organic acid/salt from the group consisting of citric acid/potassium citrate, acetic acid/potassium acetate and ascorbic acid/potassium ascorbate.

4. A composition comprising:
a slurry for chemical mechanical polishing a metal material;
an oxidizing agent for the metal material;
an abrasive; and
a buffer present in an amount sufficient to at least double a differential between a signal measured at a material removal start point and the material removal endpoint relative to a slurry without the buffer;
wherein the composition is suitable For use in a chemical mechanical polish process.

5. The composition of claim 4, wherein the oxidizing agent is hydrogen peroxide.

6. The composition of claim 4, wherein the buffer is a weak organic acid/salt pair.

7. The composition of claim 6, wherein the weak organic acid /salt pair comprises one of the group consisting of citric acid/potassium citrate, acetic acid/potassium acetate and ascorbic acid/potassium ascorbate.

8. The composition of claim 4, wherein the metal material comprises one of the group consisting of tungsten and titanium nitride.

9. The composition of claim 4, wherein the abrasive comprises one of the group consisting of silica and alumina.

10. The composition of claim 4, wherein the endpoint signal of the composition is enhanced over an endpoint signal of a composition comprising a slurry, an oxidizing agent, and an abrasive and without a buffer by at least a factor of two.

11. A kit comprising;
a slurry for chemical mechanical polishing a metal material;
art oxidizing agent for the metal material;
an abrasive; and
a buffer in an amount sufficient to at least double a differential between a signal measured at a material removal start point and the material removal endpoint relative to a slurry without the buffer,
wherein the slurry, the oxidizing agent, the abrasive, and the buffer are to be combined into a polish suitable for a chemical mechanical polish operation.

12. The kit of claim 11, wherein the metal material comprises one of the group consisting of tungsten and tantalum nitride.

13. The kit of claim 11, wherein the abrasive comprises one of the group consisting of silica or alumina.

14. The kit of claim 11, wherein the buffer is an organic acid/salt pair.

15. The kit of claim 14, wherein the organic acid/salt pair comprises one of the group consisting of citric acid/potassium citrate, acetic acid/potassium acetate and ascorbic acid/potassium ascorbate.

16. The kit of claim 11, wherein the endpoint signal of the polish is enhanced over the endpoint signal of a polish comprising a slurry, an oxidizing agent, and an abrasive and without a buffer by at least a factor of two.

* * * * *